United States Patent
Perner et al.

(10) Patent No.: US 6,781,906 B2
(45) Date of Patent: Aug. 24, 2004

(54) MEMORY CELL SENSING INTEGRATOR

(75) Inventors: Frederick Perner, Palo Alto, CA (US); Lung Tran, Saratoga, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 10/299,501

(22) Filed: Nov. 19, 2002

(65) Prior Publication Data

US 2004/0095827 A1 May 20, 2004

(51) Int. Cl.[7] ............................................... G11C 7/02
(52) U.S. Cl. .................. 365/209; 365/158; 365/189.09
(58) Field of Search ........................... 365/209, 189.07, 365/189.09, 204, 158

(56) References Cited

U.S. PATENT DOCUMENTS

| | | | |
|---|---|---|---|
| 6,259,644 B1 | 7/2001 | Tran et al. | 365/203 |
| 6,317,376 B1 * | 11/2001 | Tran et al. | 365/210 |
| 6,341,084 B2 * | 1/2002 | Numata et al. | 365/158 |
| 6,590,804 B1 * | 7/2003 | Perner | 365/158 |

* cited by examiner

Primary Examiner—Anh Phung
Assistant Examiner—Pho M. Luu
(74) Attorney, Agent, or Firm—Brian R. Short

(57) ABSTRACT

A memory cell sensor including an integrator for sensing a logical state of a memory cell. An integrator calibration circuit provides a corrective bias to the integrator, the corrective bias being based upon a difference between an initial integrator output value and a reference value. Another embodiment includes a method of sensing a logical state of a memory cell. The memory cell being sensed by an integrator. The method includes determining an initial integrator output value when a corrective bias of the integrator is zeroed, generating a correction value by comparing the initial integrator output value to a reference value, and applying the correction value to the corrective bias of the integrator.

24 Claims, 12 Drawing Sheets

MEMORY CELL SENSING INTEGRATOR

FIELD OF THE INVENTION

The invention relates generally to electronic memory. More particularly, the invention relates to a memory cell sensing integrator.

BACKGROUND OF THE INVENTION

Computing devices require memory. The memory can include read only memory (ROM) or random access memory (RAM). Generally, memory includes memory cells that are arranged in rows and columns. The individual memory cells are accessed through the use of row select lines and column select lines, typically referred to as word lines and bit lines.

FIG. 1 shows an array of random access memory (RAM) cells 110, a row decoder 120, a column decoder 130 and associated sense amplifiers 140. The row decoder 120 selects a row of the array of RAM cells 110 through a word line (WL). The column decoder 130 selects a column of the array of the RAM cell 110 through a bit line (BL). Generally, the sense amplifiers 140 are connectable to the bit lines. The sense amplifiers 140 provide sensing of states of the memory cells.

In a resistive RAM array, the resistance of each memory cell has more than one state. The data in a memory cell can be determined by measuring a resistive state of the cell. The resistive memory cells may include magnetic layers, a fuse or anti-fuse, or any element that stores information affecting a magnitude of a nominal resistance of the memory cell.

Magnetic random access memory (MRAM) is a type of resistive memory. MRAM can include a resistive cross point array of spin dependent tunneling (SDT) junctions. Each SDT junction memory element is located at a cross point of a word line and a bit line. The magnetization of each SDT junction assumes one of two stable orientations at any given time. These two stable orientation, parallel and anti-parallel, represent logic values of "0" and "1." The magnetization orientation affects the resistance of the SDT junction. The resistance of the SDT junction is a first value if the magnetization orientation is parallel and a second value if the magnetization orientation is anti-parallel. The magnetization orientation of the SDT junction, and therefore, its logic value may be determined by sensing the resistance of the SDT junction.

Generally, sensing the resistance of an SDT junction requires sensing relatively small signals. The resistance, and therefore, the logical state of an SDT junction can be determined by applying a voltage across the SDT junction and sensing the resultant current, or by applying a current through the SDT junction and sensing the resulting voltage across the SDT junction. SDT junctions include physical characteristics that require sensing either a small amplitude sense current, or a small amplitude sense voltage.

In sensing the state of a memory cell in a memory cell array, secondary undesirable currents can be generated through unselected memory cells. Generally, all of the memory cells are coupled together through many parallel paths. Consequently, in addition to a sense current flowing through the selected memory cell, secondary or sneak path currents can flow through a number of unselected cells. These combined sneak path currents can detract and even obscure the actual sense current of the selected memory cell.

Variations in the resistance of the memory cells can make sensing the resistance of the memory cells difficult. That is, the resistance of MRAM memory cells can vary from memory cell to memory cell. A sense current resulting from a sense voltage applied to a selected memory cell will vary as greatly as the resistance of the MRAM cell. This can make sensing the resistance, and therefore, the logical state of a memory cell difficult.

Memory cell sensing can also be made difficult due to physical variations of electronic components within a memory cell sensor.

It is desirable to have an apparatus and method for sensing logical states of memory cells that can withstand resistive variations of logic states associated with the memory cells. The apparatus and method should be able to withstand physical variations of electronic components, and be operable at low signal levels. The system and method should be adaptable for used with arrays of MRAM memory cells.

SUMMARY OF THE INVENTION

The invention includes an apparatus and method for sensing logical states of memory cells that can withstand resistive variations of logic states associated with the memory cells. The system and method can withstand physical variations of electronic components, and is operable at low signal levels. The system and method are adaptable for use with MRAM.

An embodiment of the invention includes a memory cell sensor. The memory cell sensor includes an integrator for sensing a logical state of a memory cell. An integrator calibration circuit provides a corrective bias to the integrator, the corrective bias being based upon a difference between an initial integrator output value and a reference value.

Another embodiment of the invention includes a method of sensing a logical state of a memory cell. The memory cell being sensed by an integrator. The method includes determining an initial integrator output value when a corrective bias of the integrator is zeroed, generating a correction value by comparing the initial integrator output value to a reference value, and applying the correction value to the corrective bias of the integrator.

Other aspects and advantages of the present invention will become apparent from the following detailed description, taken in conjunction with the accompanying drawings, illustrating by way of example the principles of the invention.

DETAILED DESCRIPTION

Figure 1:
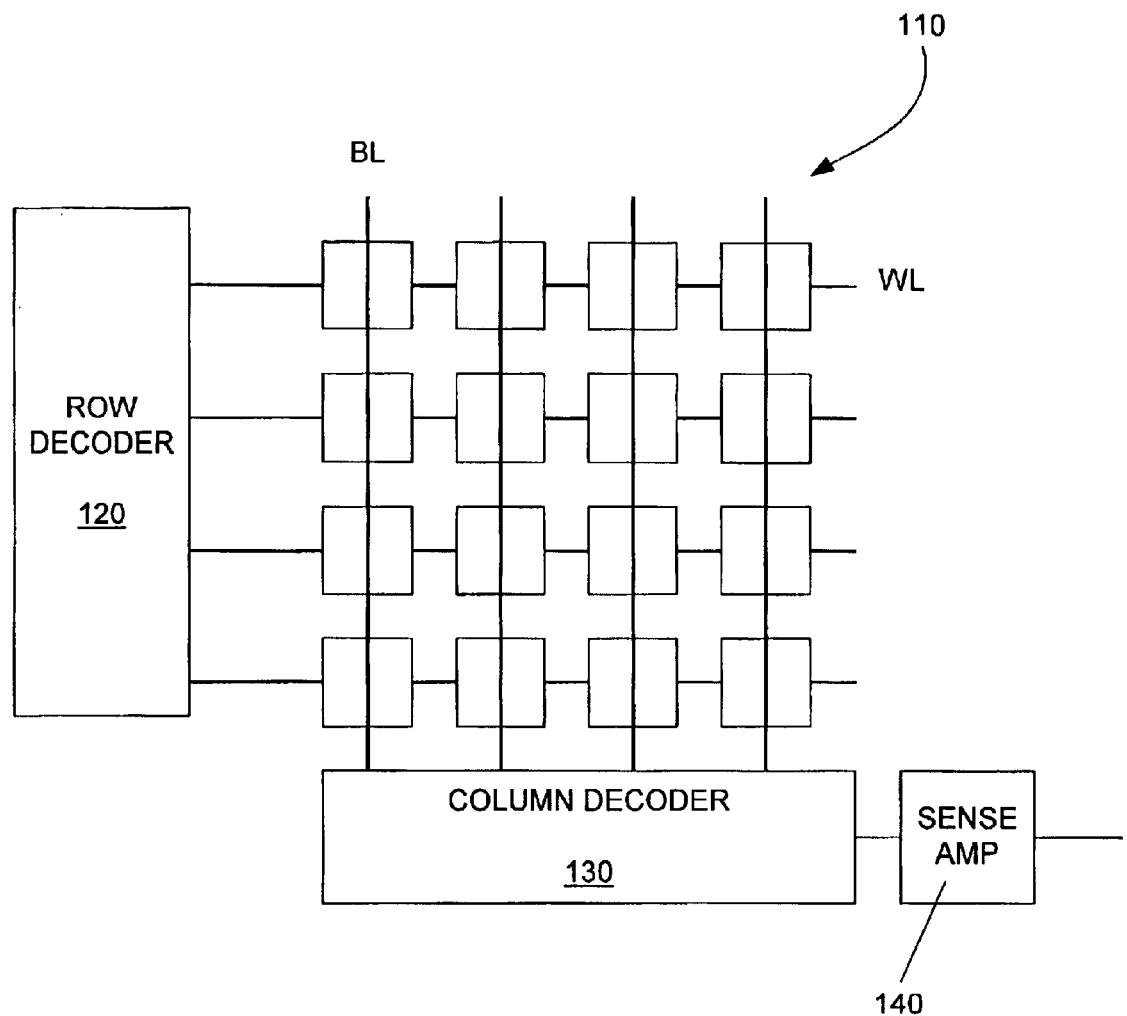
FIG. 1 shows a prior art integrated circuit that includes an array of memory cells and associated control circuitry located on a common plane.

As shown in the drawings for purposes of illustration, the invention is embodied in an apparatus and method for sensing logical states of memory cells that can withstand resistive variations of logic states associated with the memory cells. The system and method can withstand physical variations of electronic components, and is operable at low signal levels. The system and method are adaptable for use with MRAM.

The resistance of each memory cell within a resistive RAM array has more than one state, and data in the memory can be determined by measuring the resistive state of the cell. The resistive memory cells can include one or more magnetic layers, a fuse or anti-fuse, or any element that stores or generates information by affecting the magnitude of the nominal resistance of the element. Other types of resistive elements used in a resistive RAM array include polysilicon resistors as part of a read-only memory, or floating gate transistors as part of optical memory, imaging devices or floating memory devices.

Figure 2:
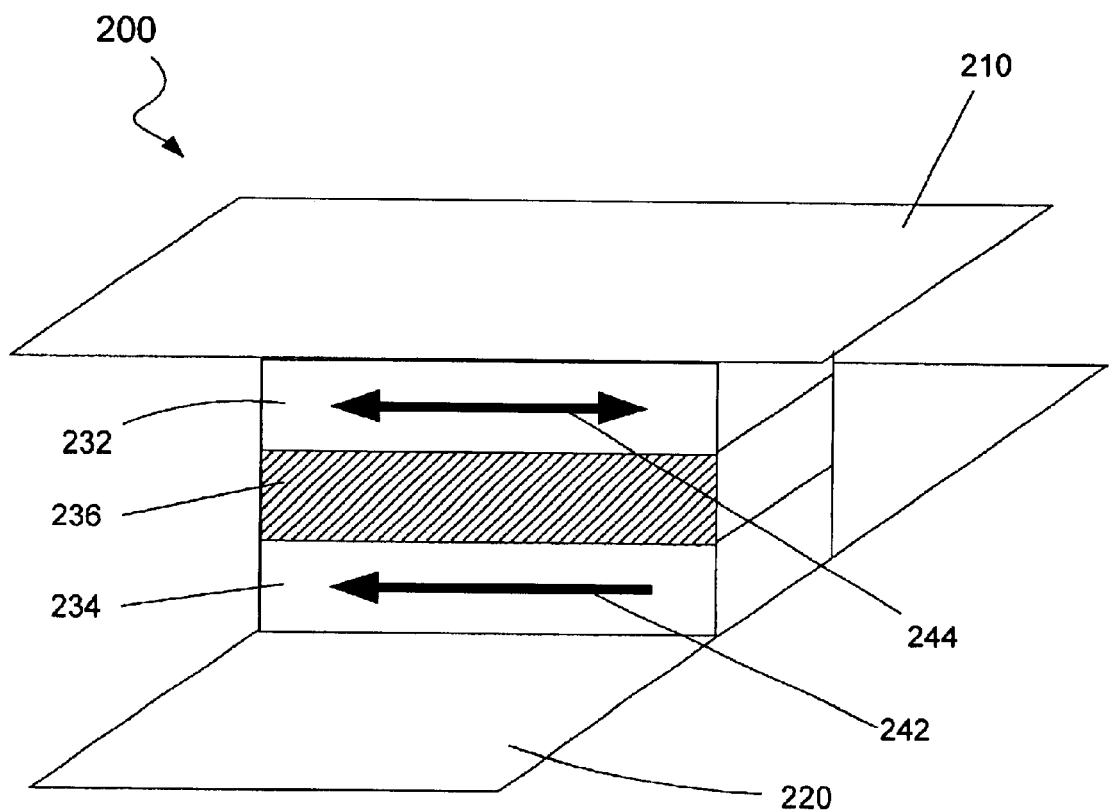
FIG. 2 shows an MRAM memory cell.

FIG. 2 shows an MRAM memory cell 200. The MRAM memory cell 200 can include a three layer magnetic tunnel junction memory cell. The magnetic tunnel junction stores a bit of information according to an orientation of a magnetic sense layer 232. Generally, the memory cell 200 includes two magnetic states that correspond to logical states of "1" and "0." The two-way arrow 244 of the sense layer 232 represents the binary states of the memory cell 200.

The memory cell 200 further includes a pinned layer 234. The pinned layer 234 includes a fixed magnetic orientation as depicted by the one-way arrow 242. As the name suggests, the magnetic orientation of the pinned layer 234 remains fixed.

The pinned layer 234 and the sense layer 232 are physically separated by an insulating layer 236. A resistance across the magnetic tunnel junction memory cell is determined by characteristics of the insulating layer, and the magnetic orientation of the sense layer 232 relative to the magnetic orientation of the pinned layer 234. If the magnetic orientation of the sense layer 232 is in the same direction as the magnetic orientation of the pinned layer 234, the memory cell 200 is in a "parallel" state. Similarly, if the magnetic orientation of the sense layer 232 is in the opposite direction as the magnetic orientation of the pinned layer 234, the memory cell 200 is in an "anti-parallel" state. The two mentioned orientations correspond to a low resistance state and a high resistance state, respectively. The low resistance state can correspond to the "0" state, and the high resistance state can correspond to the "1" state, or vice versa.

The magnetic state of a selected memory cell 200 can be altered by applying currents through a word line 210 and bit line 220 that are connected to each end of the memory cell 200. Currents conducting through the word line and the bit line produce two orthogonal magnetic fields that can switch the magnetic orientation of the sense layer 232 of the selected memory cell between the parallel and anti-parallel states. Unselected memory cells within an array of memory cells are exposed to only a magnetic field from either the word line or the bit line crossing (connected to) the unselected memory cells. The single field exposure is generally not strong enough to change the magnetic orientation of the sense layer 232 of the unselected memory cells. Therefore, the unselected memory cells retain their original magnetic orientations.

Figure 3:
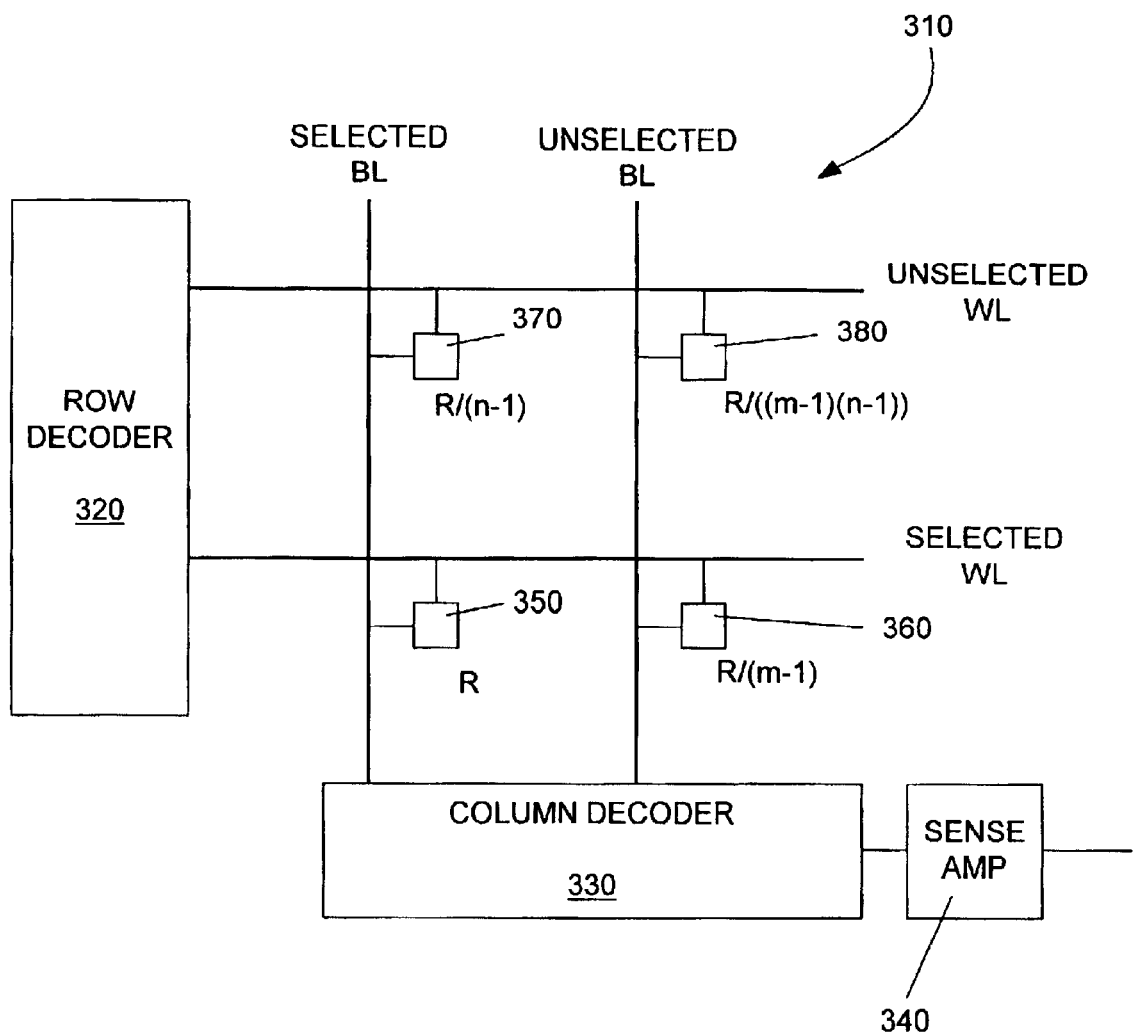
FIG. 3 shows a circuit schematic of an array of resistive MRAM memory cells and sense amplifiers.

FIG. 3 shows a circuit schematic of an array of resistive MRAM memory cells 310 and sense amplifiers 340. Here, the memory cells include resistors 350, 360, 370, 380. Generally, a row selector 320 selects rows of the memory cells through word lines (WL), and a column selector 330 selects columns of the memory cells through bit lines (BL).

FIG. 3 provides a depiction of the resistance of a selected memory cell relative to the combined resistances of the unselected memory cell in a memory array having m columns and n rows. The selected memory cell 350 is located between the selected bit line (BL) and the selected word line (WL), and includes a resistance value represented by R.

There are m−1 other memory cells in the same word line as the selected memory cell 350. Assuming the other memory cells each have nominally the same resistance value R, then they have a cumulative resistance value of R/(m−1), as shown by the equivalent resistance element 360. Similarly, there are n−1 other memory cells in the same bit line or column as the selected memory cell 350. Assuming the other memory cells each nominally have the same resistance value R, the they have a cumulative resistance value of R/(n−1), as shown at resistive element 370. Finally, there are (m−1)(n−1) other memory cells in the rest of the memory array that are not located on the same word line and bit line as the selected memory cell 350. Assuming each of these memory cells has a resistance value of R, then they have a cumulative resistance of R/((m−1)(n−1)), as shown at resistive element 380.

The proposed analysis suggests that the resistance in parallel with the selected memory cell is the combined resistance of all of the unselected memory cells 360, 370, 380. More precisely, this resistance can be represented as:

$$RU(\text{unselected}) = R/(m-1) + R/(n-1) + R/((m-1)(n-1))$$

Clearly, the cumulative resistance RU of the unselected memory cells is far less than the resistive value R of the selected memory cell. For example, in a memory array having 1000 word lines and 1000 bit lines, the cumulative resistance of the unselected memory cells is about 1/500 of the resistance of the selected memory cell. Therefore, for this example, the sneak current can be about 500 times greater that the current flowing through the selected memory cell.

Figure 4:
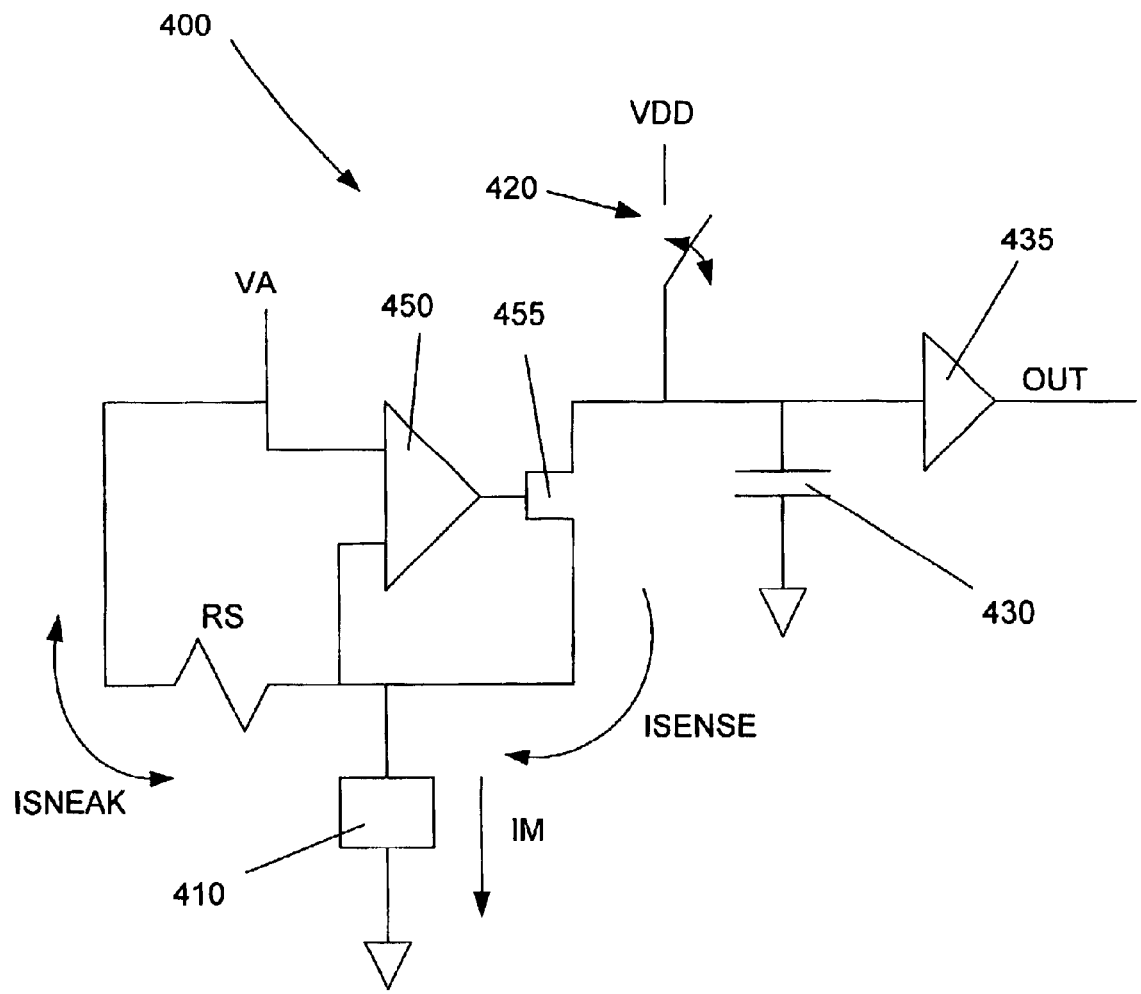
FIG. 4 shows a memory sensing integrator.

FIG. 4 shows a memory sensing integrator 400. When sensing a logic state of a memory cell 410, an integrator switch 420 is opened. As previously described, the resistance across the memory cell (MRAM) 410 varies depending upon what logical state is stored within the memory cell 410.

A voltage (VA) can be applied to the memory cell 410, a resulting current IM is conducted by the memory cell 410. As previously described, the logical state of the memory cell 410 can be determined by sensing the resultant current conducted by the memory cell 410, and therefore, the resistive state of the memory cell 410.

A closed loop feedback circuit including an operational amplifier 450 and a pass transistor 455 applies a constant voltage to the selected memory cell 410, and the sneak path resistor RS. The constant voltage is set by the input voltage VA and is maintained by regulating the current flowing through the pass transistor 455. Under ideal conditions, the regulated voltage is exactly equal to VA. In this case, the net voltage potential across RS is zero causing the current conducting through RS to be zero, and the current conducting through the pass transistor 455 (ISENSE) to be equal to the current conducting through the selected memory cell 410. This circuit applies the principle of equi-potential isolation to minimize the effects of RS. Note that under the assumed ideal conditions, the circuit tolerates very low values of RS.

A sense current (ISENSE) is conducted that includes current IM conducted by the memory cell 410, and the previously described sneak current (ISNEAK) of the non-selected memory cells (RS). When the integrator switch 420 is opened, the sense current (ISENSE) is conducted from the integrator capacitor 430. The resistance, and therefore, the logical state of the memory cell 410 is determined by measuring the rate at which the integrator capacitor discharges. That is, if the memory cell 410 includes a high resistance state, the sense current (ISENSE) will be smaller than if the memory cell 410 includes a low resistance state. Therefore, the rate that the integrator discharges can be used to determine the logical state of the memory cell 410. More precisely, the integrator capacitor 430 discharges more slowly if the memory cell 410 includes a high resistance, and the integrator capacitor 430 discharged more quickly if the memory cell 410 includes a low resistance.

The discharge rate of the integrator capacitor 430 can be determined by determining the time required for the output (OUT) of the integrator to decay to the point that the integrator capacitor 430 is fully discharged. This discharge time can be determined (as described later) by converting the output (OUT) to a digital value through an analog to digital converter (ADC) and counter, which digitally counts how long it takes for the analog value of the ADC to go to a reference level (reflecting that the integrator capacitor 430 is fully discharged).

A digital counter can be used to perform the digital counting. The digital counter counts as long as the analog value into the ADC is above a reference value (more precisely, the integrator capacitor 430 has not fully discharged). The greater the final-count value of the digital counter, the slower the decay rate of the voltage on the integrator capacitor. Therefore, the greater the digital counter value, the slower the discharge rate of the integrator capacitor, and therefore, the greater the resistance of the memory cell 410.

As will be described, there are optimal ranges of discharge rates of the integrator capacitor.

Figure 5:
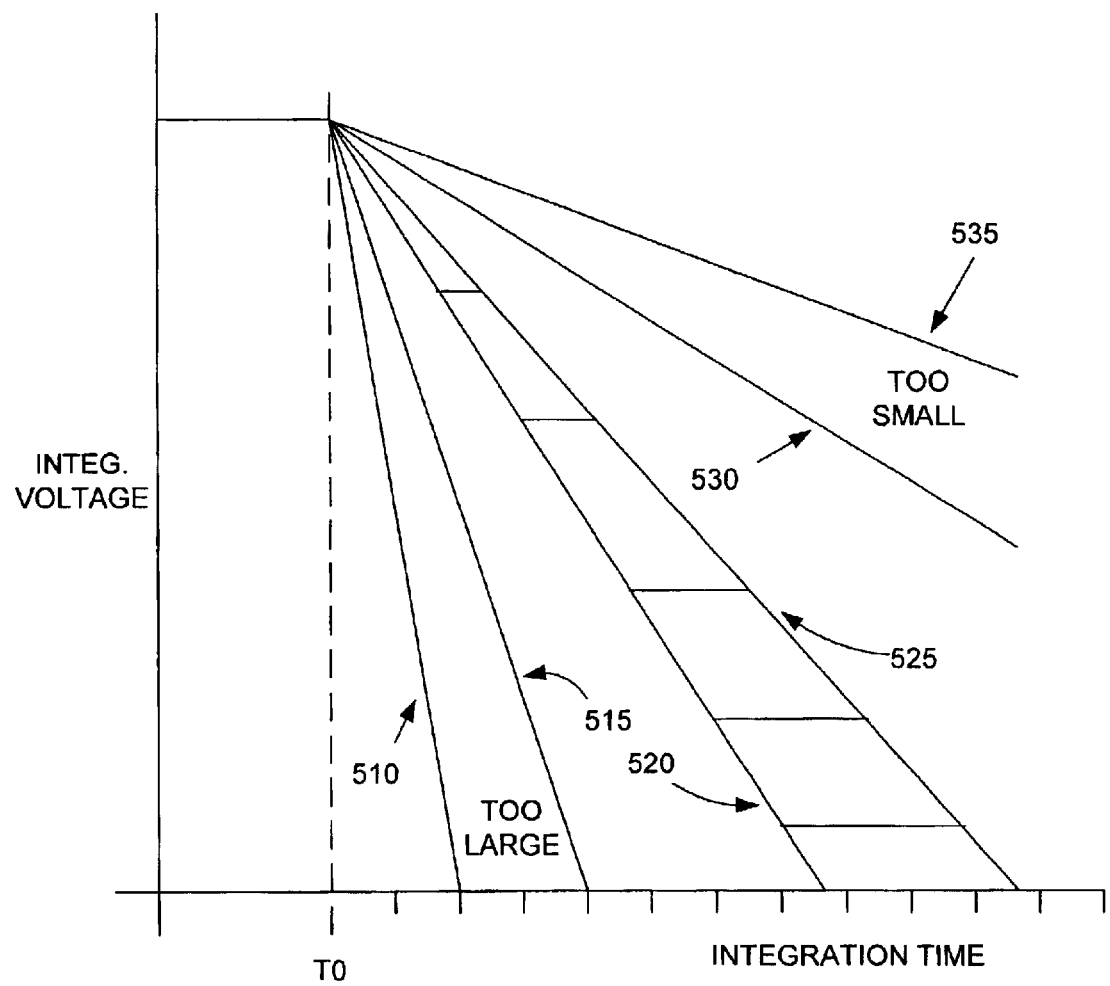
FIG. 5 shows voltage potentials of a sensing integrator during sense operations.

FIG. 5 shows voltage potentials across the integrator capacitor 430 during sense operations. More specifically, FIG. 5 shows several curves 510, 515, 520, 525, 530, 535 representing an integrator voltage (generally, the voltage across the integrator capacitor) discharge rate. As previously described, the integrator capacitor will discharge at a slower or faster rate depending upon the resistance of the memory cell being sensed.

A first set of two curves 510, 515 depict a first integrator discharge rate. The first curve 510 decays more quickly than the second curve 515. The first curve 510 represents the discharge rate for a low resistance state of the memory cell. The second curve 515 represents the discharge rate of a high resistance state of the memory cell.

The first set of two curves 510, 515 represent a situation in which the sense current is too large, and the integrator capacitor discharge too fast. As previously described, the discharge rate can be determined by a digital counter. However, if the discharge rate is too fast, the counter may not have the resolution to consistently determine a difference between the two discharge rates. That is, the time difference between the first curve 510 and the second curve 515 can be so small that the differences in the digital count value are too small to accurately detect a difference between the first resistive state and the second resistive state. When this situation arises, it is desirable to reduce the discharge rate of the integrator capacitor so that the resolution between the high memory cell resistance discharge rate and the low memory cell resistance discharge rate is greater.

A second set of two curves 520, 525 represent a desirable discharge rate of the integrator capacitor 430. The first curve 520 represents the discharge rate of the integrator capacitor 430 when the memory cell 410 includes a low resistance. The second curve 525 represents the discharge rate of the integrator capacitor 430 when the memory cell 410 includes a low resistance.

A third set of two curves 530, 535 represent a situation in which the sense current is too small, and the integrator capacitor discharges too slow. As previously described, the discharge rate can be determined by a digital counter. However, if the discharge rate is too slow, the counter may reach its maximum count, before the integrator capacitor 430 has fully discharged. In this case, there is no way to resolve between the two states of the memory cell 410.

Figure 6:
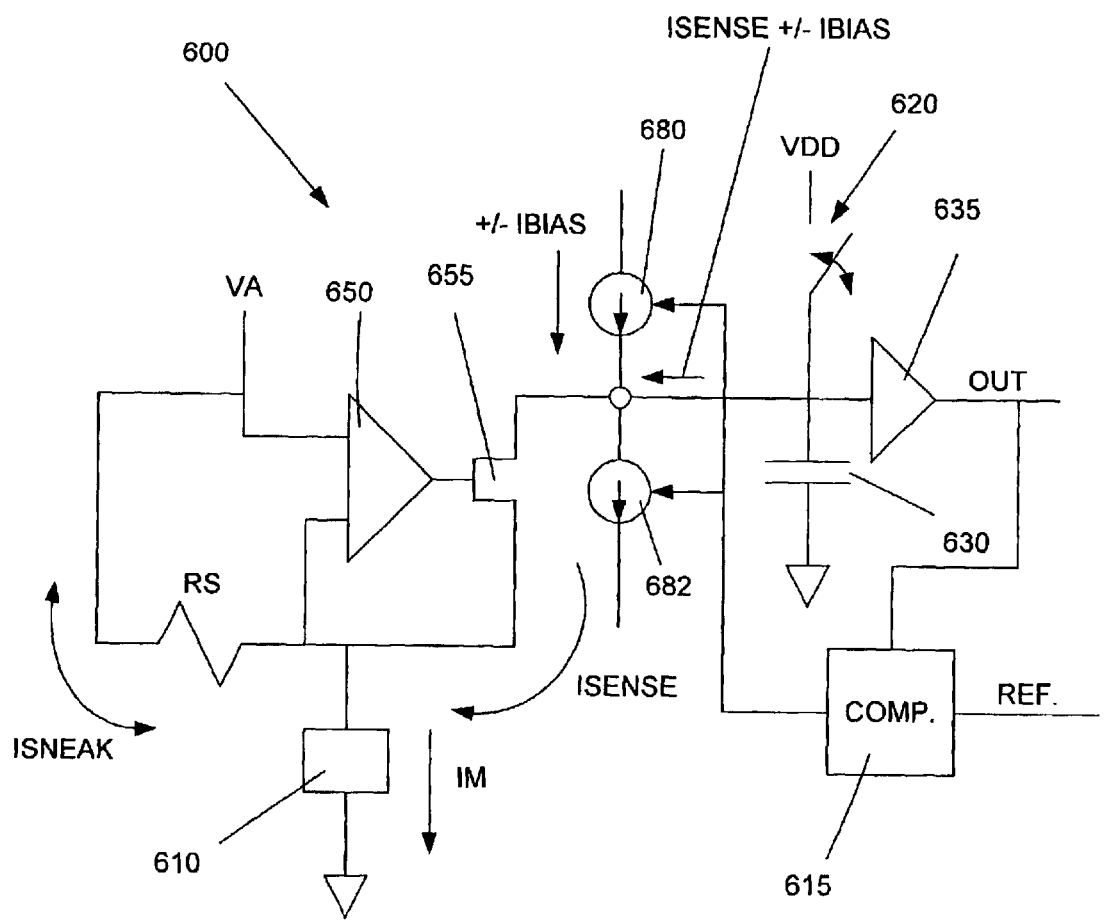
FIG. 6 shows a block diagram of a sensing integrator according to an embodiment of the invention.

FIG. 6 shows a block diagram of a sensing integrator 600 according to an embodiment of the invention. The sensing integrator 600 can be utilized as a memory cell sensor. The sensing integrator 600 senses a logical state of the memory cell 610. The memory cell 610 can be an MRAM memory cell. The sensing integrator includes an integrator calibration circuit for providing a corrective bias (BIAS) to the integrator, the corrective bias based upon a difference between an initial integrator output value and a reference value. Generally, the integrator calibration circuit includes a comparator 615, a controllable current source 680 and controllable current sink 682.

When sensing a logic state of a memory cell 610, an integrator switch 620 is opened. As previously described, the resistance across the memory cell (MRAM) 610 varies depending upon what logical state is stored within the memory cell 610.

The initial integrator output value can be determined when the corrective bias (BIAS) is zeroed. The reference value is a predetermined value that reflects the optimal discharge rate of the integrator capacitor 630. As previously described, the optimal rate generally provides for the most resolution between the least two logical states of the memory cell 610.

The sensing integrator includes an integrator capacitor 630, and an output amplifier 635. The integrator capacitor 630 discharges at a first rate when the memory cell 610 stores a first state, and the integrator capacitor 630 discharging at a second rate when the memory cell 610 stores a second rate. The corrective bias (BIAS) influences at least one of the first rate and the second rate. The corrective bias (BIAS) can ensure that a discharge time of the integrator capacitor 630 is greater than a first predetermined discharge time, and the corrective bias (BIAS) can ensure that the discharge time of the integrator capacitor to is less than a second predetermined discharge time. As previously described, there is generally an optimal discharge time of the integrator capacitor 630. Generally, the optimal discharge time falls between the first predetermined discharge time and the second predetermined discharge time.

Generally, the comparator 615 compares the output (OUT) of the integrator with a reference voltage, and then either adds to the sense current (ISENSE) or subtracts from the sense current (ISENSE) depending upon the difference between the output (OUT) and the reference voltage. More specifically, the output (OUT) is sampled while the controllable current source 680 and the controllable current sink 682 are adjusted. This sampled reference includes all potential errors due to the sneak current and device errors. The sampled output is then compared with a reference voltage which represents an ideal integrator voltage at a particular point in time. Feedback is provided to the controllable current source 680 and the controllable current sink 682 to adjust the sense current (ISENSE) so that the actual integrator voltage is closer to the reference voltage. The result is that the discharge rates of the integrator capacitor 630 are forced to be similar to the ideal discharge rates represented by the curves 520, 525 of FIG. 5.

Figure 7:
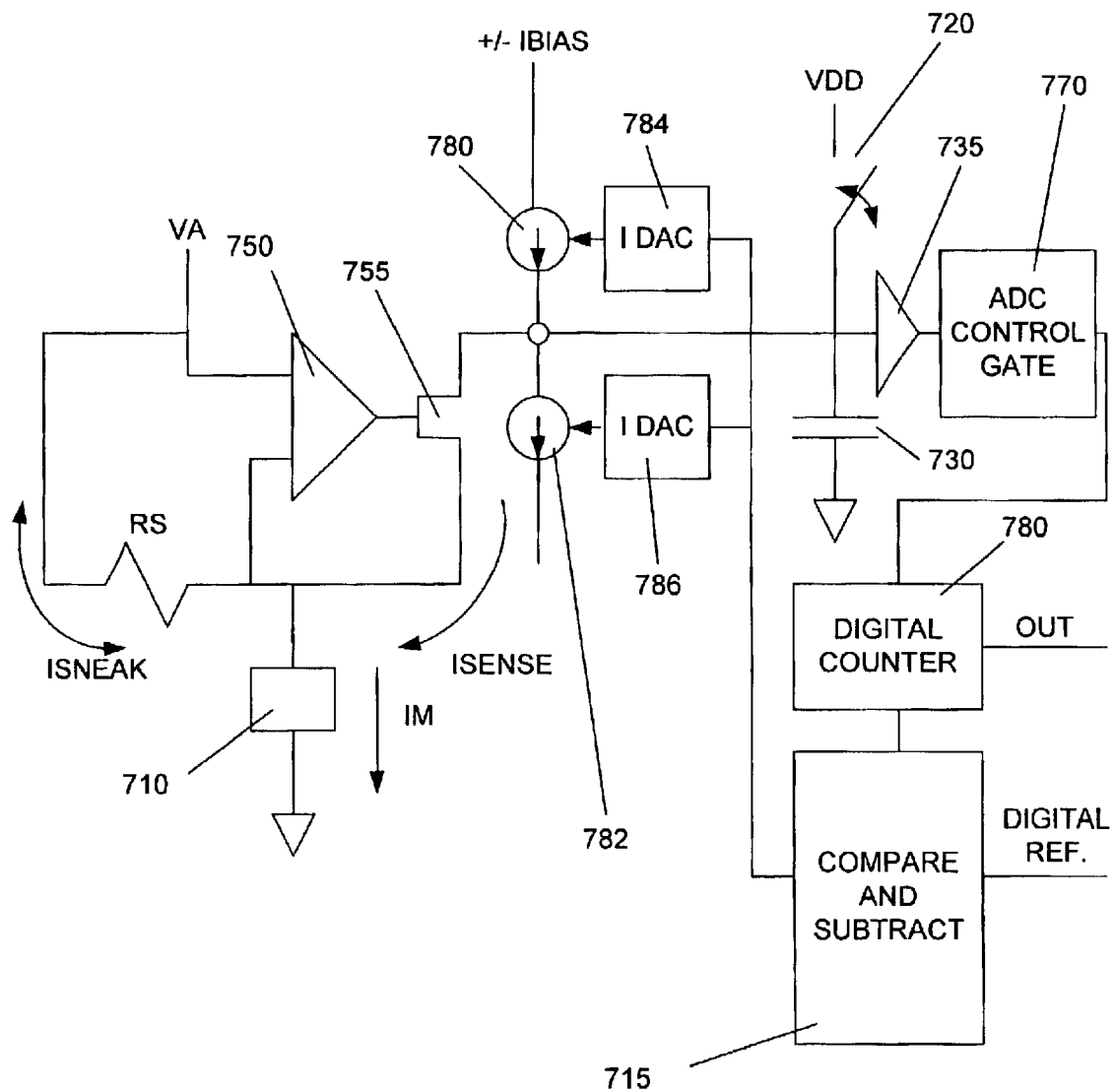
FIG. 7 shows a digital implementation of a sensing integrator according to an embodiment of the invention.

FIG. 7 shows a digital implementation of a sensing integrator according to an embodiment of the invention. An analog to digital converter (ADC) control gate 770 receives an output from the output amplifier 735. The ADC control gate 770 provides a series of clock pulses that represent the integrator voltage. A digital output of the ADC control gate 770 is received by a digital counter 780.

When sensing a logic state of a memory cell 710, an integrator switch 720 is opened. As previously described, the resistance across the memory cell (MRAM) 710 varies depending upon what logical state is stored within the memory cell 710.

As previously described, the digital counter 780 counts the time required for the integrator capacitor 730 to fully discharge. The output of the ADC control gate 770 is a digital representation of the voltage potential, and therefore, the charge on the integrator capacitor 730. The digital counter counts until the output of the ADC control gate 770 reaches a particular value. This value indicates that the integrator capacitor 730 has discharged. The final count value of the digital counter is dependent upon the discharge time of the integrator capacitor 730. As previously stated, the discharge time of the integrator capacitor 730 is dependent upon the resistance of the memory cell 710.

A digital compare and subtract unit 715 compares the digital count value of the digital counter 780 to a digital reference (DIGITAL REF.). The digital compare and subtract unit 715 controls an adjustable current source 780, and an adjustable current sink 782, through digital to analog converter (DAC) 784, 786 controllers. Adjustable current sources, adjustable current sinks, and digital to analog converter controllers are well known in the art of electronics.

The adjustable current source 780 provides current, which reduces the amount charge conducted from the integrator capacitor 730. The adjustable current sink 782 sinks current, which increases the amount of charge conducted from the integrator capacitor 730. Therefore, the adjustable current source 780 and the adjustable current sink 782 can be used to adjust the time required to discharge the integrator capacitor 730.

A routine for calibrating or setting the adjustable current source 780 and the adjustable current sink 782 includes initially setting the adjustable current source 780 and the adjustable current sink 782 so that no current is sourced or sunk from the integrator capacitor 730. The integrator capacitor 730 is then allowed to discharge while sensing the resistance of a memory cell. The resulting count value of the digital counter 780 is then compared to the digital reference (DIGITAL REF.) by the digital compare and subtract unit 715. The digital compare and subtract unit 715 then feeds back a correction to the adjustable current source 780 and the adjustable current sink 782 that forces future final count values of the digital counter 780 to be approximately the same as the digital reference (DIGITAL REF.). The future final count values are forced to fall within a desired range, which is equivalent to forcing the integrator capacitor 730 discharge time to fall within a previously described desired time range.

The corrective bias (BIAS) can be used to influence both the first rate of integrator capacitor 730 discharge (due to a low resistive state of the memory cell 710), and the second rate of integrator capacitor 730 discharge (due to a high resistive state of the memory cell 710). The corrective bias (BIAS) (through proper selection of the DIGITAL REF.) can be used to ensure a discharge time of the integrator capacitor is greater than a first predetermined discharge time. Generally, the first predetermined discharge time will determine a lower end counter resolution between the first rate discharge time and the second rate discharge time. The DIGITAL REF. is selected to ensure that the resolution is great enough that a proper determination can be made between the resistive states of the memory cell.

The corrective bias can also cause a discharge time (both the first rate and the second rate) of the integrator capacitor to be less than a second predetermined discharge time. Again, the second predetermined discharge time is set by the reference value (DIGITAL REF.). The second predetermined discharge time can less than a highest total count time of the digital counter 780. That is, the reference value (DIGITAL REF.) is selected so that the integrator capacitor 730 is fully discharged before the digital counter 780 counts so high that the count rolls over. Alternatively, the second predetermined discharge time can determine a higher end counter resolution between the first rate discharge time and the second rate discharge time.

Figure 8:
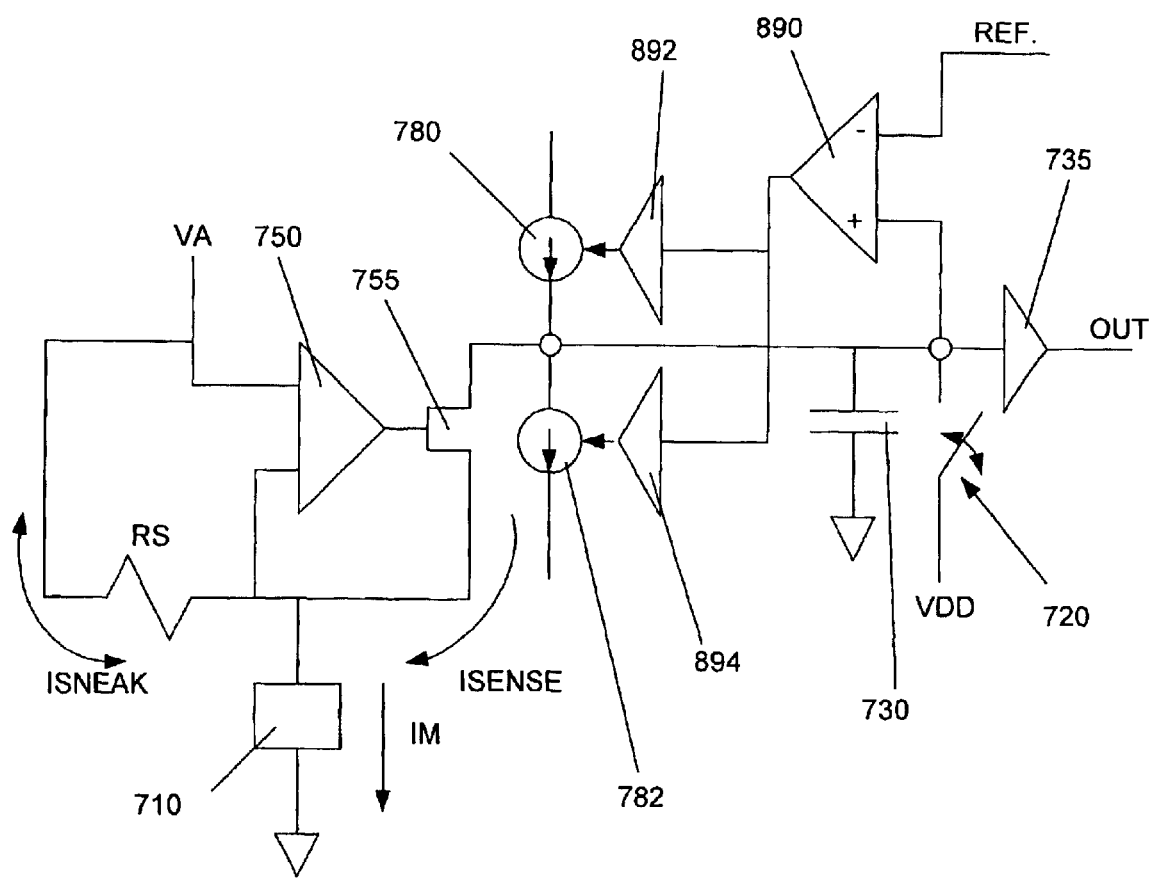
FIG. 8 shows an analog implementation of a sensing integrator according to an embodiment of the invention.

FIG. 8 shows an analog implementation of a sensing integrator according to an embodiment of the invention. This implementation includes a comparator 890 that receives a reference (REF.). Analogous to the digital implementation described above, the reference (REF.) is compared to an integrator voltage.

The comparator 890 is connected to a pair of current source drivers 892, 894. The current source drivers 892, 894 are connected to the adjustable current source 780 and the adjustable current sink 782. Comparators and current source drivers are well known in the art of electronics.

The adjustable current source 780 provides current, which reduces the amount charge conducted from the integrator capacitor 730. The adjustable current sink 782 sinks current, which increases the amount of charge conducted from the integrator capacitor 730. Therefore, the adjustable current source 780 and the adjustable current sink 782 can be used to adjust the time required to discharge the integrator capacitor 730.

A routine for calibrating or setting the adjustable current source 780 and the adjustable current sink 782 includes initially setting the adjustable current source 780 and the adjustable current sink 782 so that no current is sourced or sunk from the integrator capacitor 730. The integrator capacitor 730 is then allowed to discharge while sensing the resistance of a memory cell. After a predetermined amount of time (for example, a desired discharge time) the voltage of the integrator capacitor is compared with the reference voltage (REF.). The comparator 890 provides the current source drivers 892, 894 with a signal that indicates whether the integrator capacitor 730 should ideally discharge more quickly, or more slowly. If the integrator capacitor 730 should discharge more slowly, then the comparator 890 will cause the current source 780 to provide current. If the integrator capacitor 730 should discharge more quickly, then the comparator 890 will cause the current sink 782 to sink current. The relative amount of current sourcing or current sinking depends upon the magnitude of the difference between the voltage of the integrator capacitor 730 and the reference voltage (REF.) at the time of the comparison.

Figure 9:
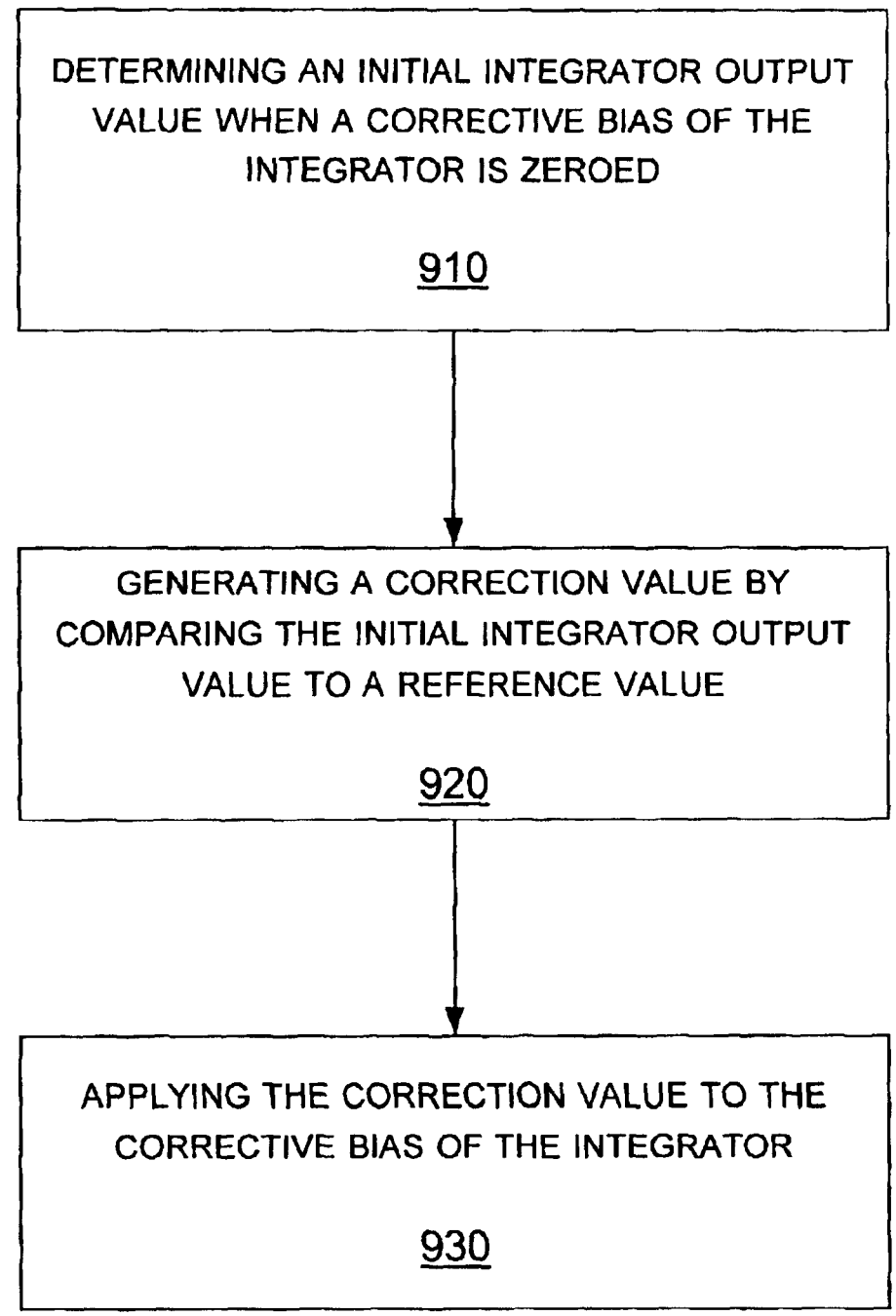
FIG. 9 shows acts of a method according to an embodiment of the invention.

FIG. 9 shows acts of a method according to an embodiment of the invention. The method includes sensing a logical state of a memory cell. Generally, the memory cell is sensed by an integrator sensor.

A first step 910 includes determining an initial integrator output value when a corrective bias of the integrator is zeroed.

A second step 920 includes generating a correction value by comparing the initial integrator output value to a reference value.

A third step 930 includes applying the correction value to the corrective bias of the integrator.

The integrator can include an integrator capacitor. Generally, the integrator capacitor discharges at a first rate when the memory cell stores a first state, and the integrator capacitor discharges at a second rate when the memory cell stores a second rate. The corrective bias influences at least one of the first rate and the second rate. The corrective bias can cause a discharge time of the integrator capacitor to be greater than a first predetermined discharge time.

If the output of the integrator is connected to digital counter the first predetermined discharge time can determines a lower end counter can also cause a discharge time of the integrator capacitor to be less than a second predetermined discharge time. The second predetermined discharge time can be less than a highest total count time of the digital counter.

Figure 10:
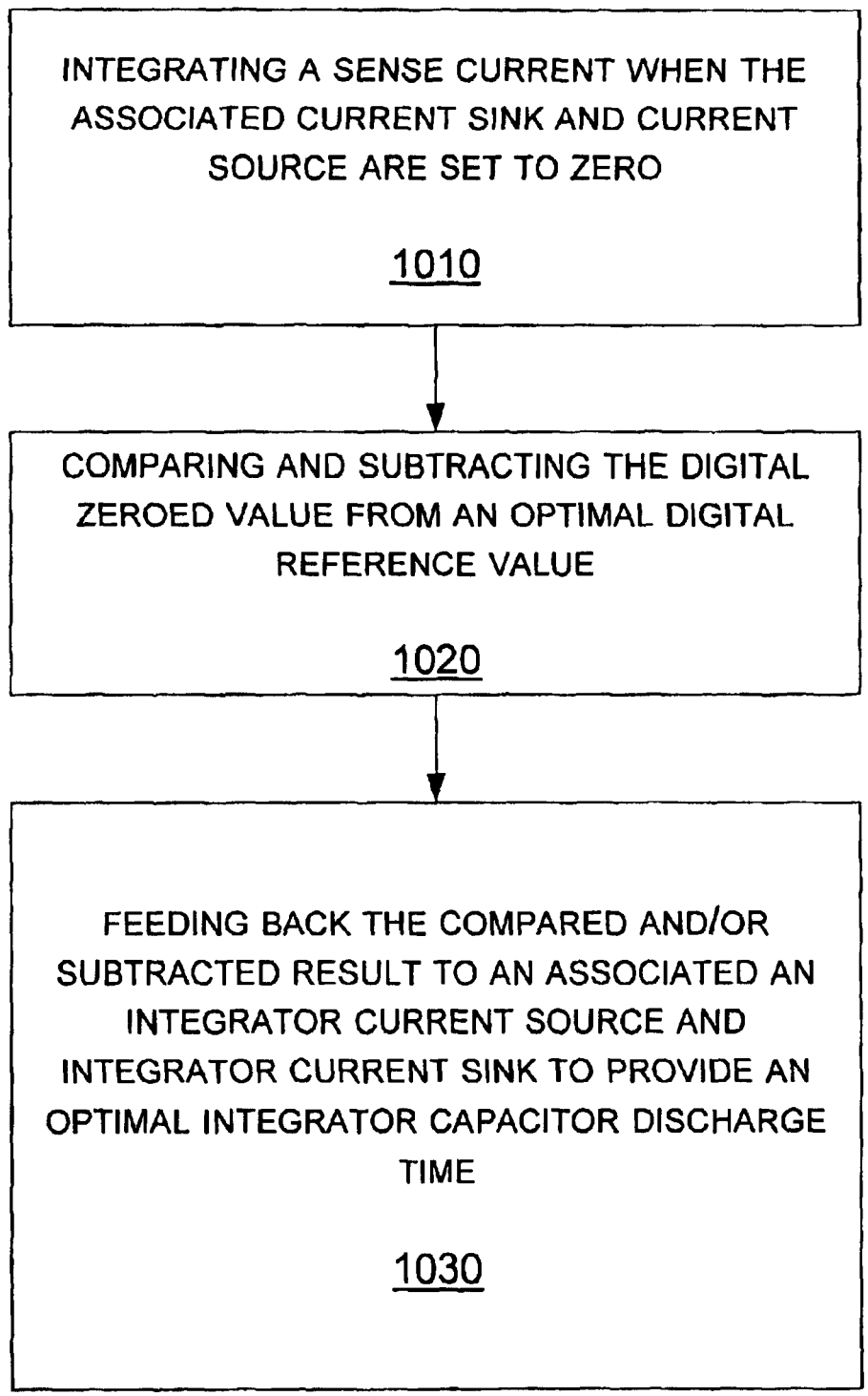
FIG. 10 shows acts of a method according to another embodiment of the invention.

FIG. 10 shows acts of a method according to another embodiment of the invention. This method is adaptable for use with a digital implementation (such as described by FIG. 7) of a sensing integrator.

A first step 1010 includes integrating a sense current when the associated current sink and current source are set to zero. This provides a digital zeroed value at the associated digital counter.

A second step 1020 includes comparing and subtracting the digital zeroed value from an optimal digital reference value (DIGITAL REF.).

A third step 1030 includes feeding back the compared and/or subtracted result to an associated an integrator current source and integrator current sink to provide an optimal integrator capacitor discharge time.

Figure 11:
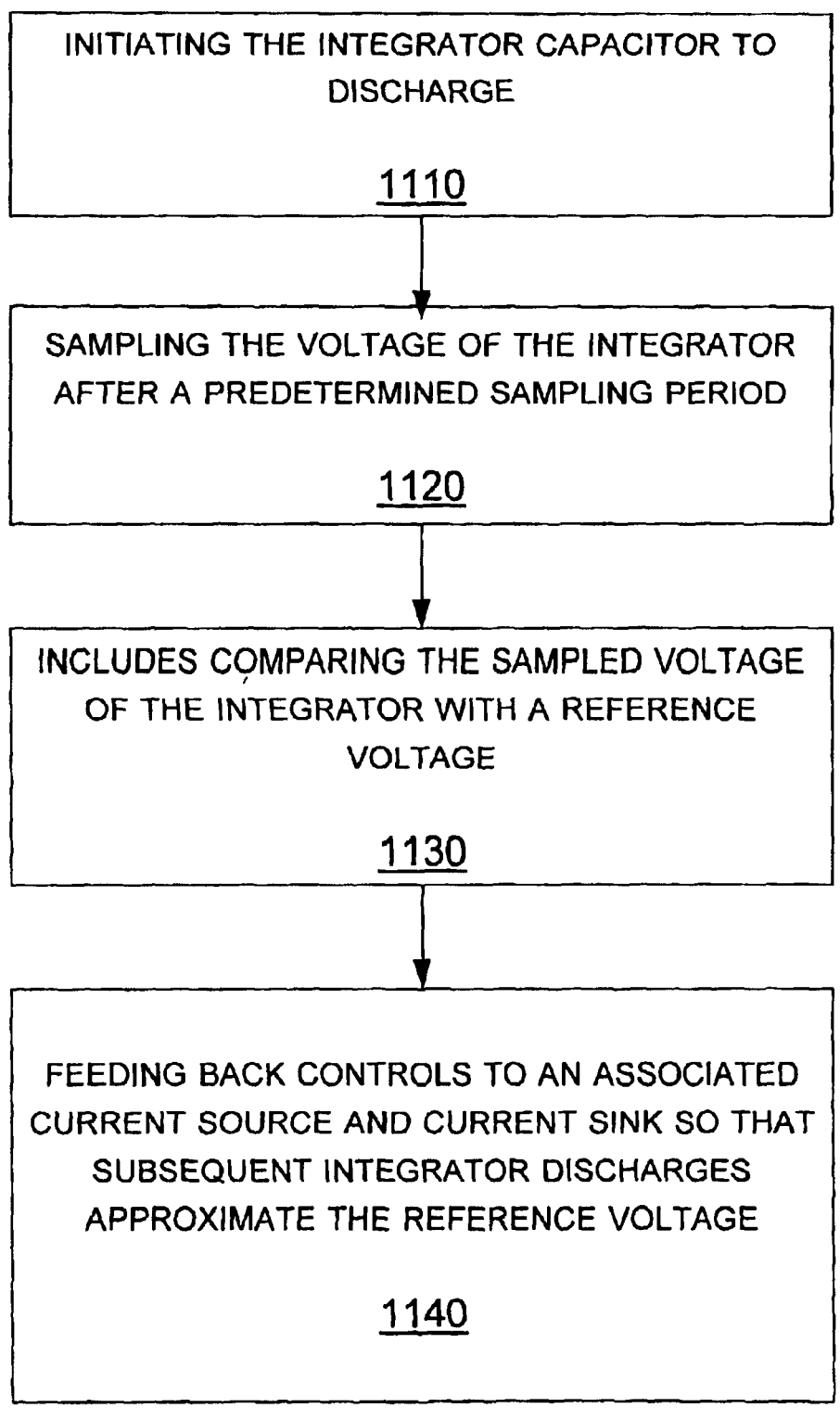
FIG. 11 shows acts of a method according to another embodiment of the invention.

FIG. 11 shows acts of a method according to another embodiment of the invention. This method is adaptable for use with an analog implementation (such as described by FIG. 8) of a sensing integrator.

A first step 1110 includes initiating the integrator capacitor to discharge.

A second step 1120 includes sampling the voltage of the integrator after a predetermined sampling period.

A third step 1130 includes comparing the sampled voltage of the integrator with a reference voltage (REF.).

A fourth step 1140 includes feeding back controls to an associated current source and current sink so that subsequent integrator discharges approximate the reference voltage, thereby causing the integrator capacitor to discharge within a desire discharge time range.

Figure 12:
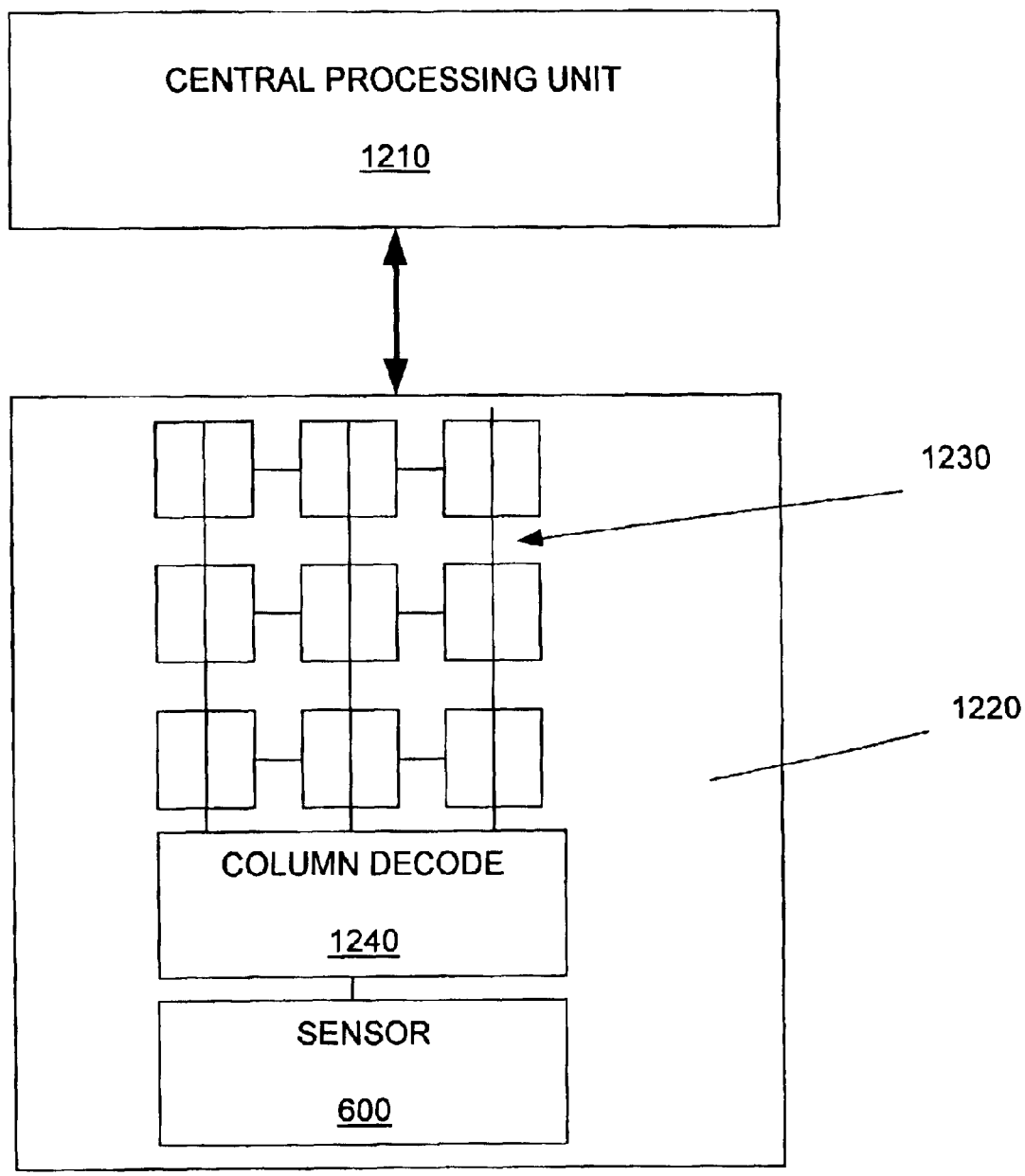
FIG. 12 shows a computer system according to an embodiment of the invention.

FIG. 12 shows a computer system according to an embodiment of the invention. This system includes a central processing unit 1210 that interfaces with an MRAM memory 1220. The MRAM system includes an integrator sensor 600 similar to the embodiment shown in FIG. 6. MRAM provides features that are desirable in computer systems. For example, MRAM is non-volatile, which is useful in some computer applications.

The MRAM memory 1220 is connected to the central processing unit 1210. The MRAM memory 1220 includes an array of MRAM cells 1230, that includes rows and columns of MRAM cells. At least one MRAM sensor 600 is connectable to the array of MRAM cells 1230 through a column decoder 1240.

Although specific embodiments of the invention have been described and illustrated, the invention is not to be limited to the specific forms or arrangements of parts so described and illustrated. The invention is limited only by the appended claims.

What is claimed is:

1. A memory cell sensor comprising:
   an integrator for sensing a logical state of a memory cell;
   an integrator calibration circuit for providing a corrective bias to the integrator, the corrective bias based upon a difference between an initial integrator output value and a reference value, wherein the corrective bias influences discharge rates of the integrator.

2. The memory cell sensor of claim 1, wherein the integrator calibration circuit comprises an integrator capacitor, the integrator capacitor discharging at a first rate when the memory cell stores a first state, and the integrator capacitor discharging at a second rate when the memory cell stores a second state.

3. The memory cell sensor of claim 2, wherein the corrective bias influences at least one of the first rate and the second rate.

4. The memory cell sensor of claim 2, wherein the corrective bias causes a discharge time of the integrator capacitor to be greater than a first predetermined discharge time.

5. The memory cell sensor of claim 4, wherein an output of the integrator is received by a digital counter, and the first predetermined discharge time determines a lower end counter resolution between the a first rate discharge time and a second rate discharge time.

6. The memory cell sensor of claim 2, wherein the corrective bias causes a discharge time of the integrator capacitor to be less than a second predetermined discharge time.

7. The memory cell sensor of claim 6, wherein an output of the integrator is received by a digital counter, and the second predetermined discharge time is less than a highest total count time of the digital counter.

8. The memory cell sensor of claim 6, wherein an output of the integrator is received by a digital counter, and the second predetermined discharge time determines a higher end counter resolution between the a first rate discharge time and a second rate discharge time.

9. The memory cell sensor of claim 2, wherein the memory cell is an MRAM memory cell, and the MRAM memory cell comprises a first resistance when the MRAM memory cell is at a first logical state, and the MRAM memory cell comprises a second resistance when the MRAM memory cell is at a second logical state.

10. The memory cell sensor of claim 9, wherein the first rate is dependent upon the first resistance and the integrator capacitor, and the second rate is dependent upon the second resistance and the integrator capacitor.

11. The memory cell sensor of claim 1, wherein the corrective bias is zeroed when the initial integrator output value is determined.

12. The memory cell sensor of claim 1, wherein the corrective bias is provided by at least one digital to analog current source, the at least one digital to analog current source being digitally controlled by a digital comparator, the digital comparator comparing a digital output of the integrator when the corrective bias is zeroed, with a digital reference value.

13. The memory cell sensor of claim 1, wherein the corrective bias is provided by at least one analog current source, the analog current source being adjustably set by a comparator, the comparator comparing an analog integrator voltage with a reference value.

14. A method of sensing a logical state of a memory cell, the memory cell being sensed by an integrator, the method comprising:

determining an initial integrator output value when a corrective bias of the integrator is zeroed;

generating a correction value by comparing the initial integrator output value to a reference value;

applying the correction value to the corrective bias of the integrator.

15. The method of sensing a logical state of a memory cell of claim 14, wherein the integrator comprises an integrator capacitor, the integrator capacitor discharging at a first rate when the memory cell stores a first logic state, and the integrator capacitor discharging at a second rate when the memory cell stores a second logic state, wherein the corrective bias influences at least one of the first rate and the second rate.

16. The method of sensing a logical state of a memory cell of claim 15, wherein the corrective bias causes a discharge time of the integrator capacitor to be greater than a first predetermined discharge time.

17. The method of sensing a logical state of a memory cell of claim 16, wherein an output of the integrator is received by a digital counter, and the first predetermined discharge time determines a lower end counter resolution between the a first rate discharge time and a second rate discharge time.

18. The method of sensing a logical state of a memory cell of claim 15, wherein the corrective bias causes a discharge time of the integrator capacitor to be less than a second predetermined discharge time.

19. The method of sensing a logical state of a memory cell of claim 18, wherein an output of the integrator is received by a digital counter, and the second predetermined discharge time is less than a highest total count time of the digital counter.

20. The method of sensing a logical state of a memory cell of claim 18, wherein an output of the integrator is received by a digital counter, and the second predetermined discharge time determines a higher end counter resolution between the a first rate discharge time and a second rate discharge time.

21. An MRAM memory comprising:

an array of MRAM cells comprising rows and columns of MRAM cells;

at least one MRAM sensor connectable to the MRAM cells, each MRAM sensor comprising:

an integrator for sensing a logical state of a memory cell;

an integrator calibration circuit for providing a corrective bias to the integrator, the corrective bias based upon a difference between an initial integrator output value and a reference value, wherein the corrective bias influences discharge rates of the integrator.

22. The MRAM memory of claim 21, wherein the integrator calibration circuit comprises an integrator capacitor, the integrator capacitor discharging at a first rate when the memory cell stores a first logic state, and the integrator capacitor discharging at a second rate when the memory cell stores a second logic state, wherein the corrective bias influences at least one of the first rate and the second rate.

23. A computer system comprising:

a central processing unit;

MRAM memory connected to the central processing unit, the MRAM memory comprising:

an array of MRAM cells comprising rows and columns of MRAM cells;

at least one MRAM sensor connectable to the MRAM cells, each MRAM sensor comprising:

an integrator for sensing a logical state of a memory cell;

an integrator calibration circuit for providing a corrective bias to the integrator, the corrective bias based upon a difference between an initial integrator output value and a reference value, wherein the corrective bias influences the discharge rates of the integrator.

24. The computer system of claim 23, wherein the integrator calibration circuit comprises an integrator capacitor, the integrator capacitor discharging at a first rate when the memory cell stores a first state, and the integrator capacitor discharging at a second rate when the memory cell stores a second rate, wherein the corrective bias influences at least one of the first rate and the second rate.

* * * * *